United States Patent
Lee

(10) Patent No.: US 6,740,976 B2
(45) Date of Patent: May 25, 2004

(54) SEMICONDUCTOR DEVICE INCLUDING VIA CONTACT PLUG WITH A DISCONTINUOUS BARRIER LAYER

(75) Inventor: Jong-Hyun Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/317,693

(22) Filed: Dec. 12, 2002

(65) Prior Publication Data

US 2003/0111735 A1 Jun. 19, 2003

(30) Foreign Application Priority Data

Dec. 13, 2001 (KR) .................................. 2001-78914

(51) Int. Cl.[7] .................. H01L 23/48; H01L 23/52; H01L 29/40
(52) U.S. Cl. .................. 257/758; 257/773; 257/774; 257/775
(58) Field of Search .................. 438/628, 673, 438/758; 257/773, 774, 775

(56) References Cited

U.S. PATENT DOCUMENTS

| | | | | |
|---|---|---|---|---|
| 4,751,563 A | * | 6/1988 | Laibowitz et al. | 257/34 |
| 6,541,374 B1 | * | 4/2003 | de Felipe et al. | 438/648 |
| 2002/0051649 A1 | * | 5/2002 | Ahn | 257/773 |
| 2003/0194872 A1 | * | 10/2003 | Parikh et al. | 438/694 |

FOREIGN PATENT DOCUMENTS

JP 2002280364 * 9/2002 ........... H01L/30/65

* cited by examiner

Primary Examiner—W. David Coleman
Assistant Examiner—William M. Brewster
(74) Attorney, Agent, or Firm—Mills & Onello, LLP

(57) ABSTRACT

In a semiconductor device with a via contact including a barrier metal layer and a method for fabricating the same, a lower metal interconnection is formed over a substrate. An ILD is formed on the lower metal interconnection and has a lower barrier layer and an upper barrier layer that have an etch selectivity with respect to each other. An upper metal interconnection is formed over the ILD and is separated from the lower metal interconnection by the ILD. A via contact plug penetrates the ILD to connect the lower and upper metal interconnections. The via contact plug is formed such that a portion crossing the lower barrier layer is formed to have a greater width as compared to a portion crossing the upper barrier layer. The barrier metal layer, which is formed to encompass sidewalls and a bottom of an inner metal layer of the via contact plug, forms a discontinuous part which does not exist at the portion crossing the lower barrier layer. Thus, the inner metal layer of the contact plug is in direct contact with the lower metal interconnection. The upper and lower barrier layers are layers that serve as a barrier to copper, such as a silicon nitride layer or silicon carbide layer. However, the upper and lower barrier layers are composed of different material layers so as to have etch selectivity with respect to each other.

11 Claims, 8 Drawing Sheets

SEMICONDUCTOR DEVICE INCLUDING VIA CONTACT PLUG WITH A DISCONTINUOUS BARRIER LAYER

RELATED APPLICATION

This application relies for priority upon Korean Patent Application No. 2001-78914, filed on Dec. 13, 2001, the contents of which are herein incorporated by reference in their entirety.

FIELD OF THE INVENTION

The present invention relates to semiconductor devices and methods for fabricating the same. More specifically, the present invention is directed to semiconductor devices including a via contact hole connecting upper and lower layers of multi-level interconnections and methods for fabricating the same.

BACKGROUND OF THE INVENTION

With ever higher integration density in semiconductor devices, interconnections become increasingly complicated. Since it is difficult to form such complicated interconnections into a single layer, multi-level interconnections formed of a plurality of layers are primarily used. Aluminum has become a popular material for interconnections of semiconductor devices, since it offers many advantages. However, since aluminum interconnections are generally formed by sputtering, it is difficult to fill a contact hole of a high aspect ratio with aluminum. At the same time, aluminum suffers from the serious shortcoming of cutting caused by electro-migration. Also, as integration increases, the width of metal interconnections and the width of contacts are reduced. For this reason, interconnection resistance and a contact resistance are increased.

Copper has been proposed as an interconnection material for semiconductor devices, as a material that enables minimization of the interconnection and contact resistances. Copper interconnections, the resistance of which is lower than that of aluminum interconnections, may decrease interconnection resistance, and may alleviate cutting caused by electro-migration, in order to thereby improve reliability. However, it is difficult to apply a patterning process to copper interconnections by etching. In addition, copper is easily diffused into a silicon layer and silicon oxide layer, thereby increasing current leakage and parasitic capacitance.

A variety of methods have been developed to solve the foregoing problems. First, a damascene process was proposed to overcome the difficulty of patterning. In the case of the damascene process, to begin with, a lower insulation layer is etched to form a groove therein. A copper layer is then stacked on the resultant structure and is planarizingly etched using chemical-mechanical polishing (CMP) until a top surface of the lower insulation layer is exposed. As a result, the copper remains only in the groove to form interconnections. It is therefore unnecessary to directly pattern the copper. Diffusion of copper may be prevented by using a barrier layer composed of a conductive layer or an insulation layer.

Meanwhile, a conductive barrier layer, referred to as a "barrier metal" among barrier layers may be used for processes of fabricating interconnections using not only copper but also gold or silver, which are also low-resistance metals suitable for interconnections. In addition, the conductive barrier layer has been widely used to fabricate aluminum or tungsten contact plugs, in order to prevent a spike phenomenon.

FIG. 1 is a cross-sectional view illustrating a step of forming a via contact in a semiconductor device with conventional multi-level interconnections. Referring to FIG. 1, a lower interconnection 13 is formed using a damascene process over a substrate 10 where a first interlayer dielectric (ILD) 11 is formed. An relatively thin insulating capping layer 15 is formed to serve as a barrier layer to prevent diffusion of copper on the lower interconnection 13, and a second ILD 17 formed of an insulation layer, for example a silicon oxide layer, is stacked on the resultant structure. The capping layer 15 and the second ILD 17 are patterned to form a via contact hole that exposes the lower interconnection. A cleaning process is conducted to remove residue from a surface of the exposed lower interconnection 13. While the capping layer 15 is etched and the surface of the lower interconnection 13 is cleaned, a portion of the copper layer may be also etched to form an undercut 25 under the capping layer 15 in the vicinity of the contact hole. A barrier metal 19 is then stacked on the substrate where the contact hole is formed. The barrier metal 19 covers an inner wall of the contact hole without filling the undercut 25. At this time, the barrier metal 19 is stacked to a relatively greater thickness on a bottom of the contact hole. However, a minute gap between the lower interconnection 13 and the capping layer 15, which is formed by the unfilled undercut 25, intervenes between the barrier metal 19 and the lower interconnection 13. After forming the barrier metal 19, a copper layer 21 is stacked to form a via contact plug that fills the contact hole.

Here, the copper layer of the lower interconnection 13 and that of the contact plug 21 are electrically connected through a thick barrier metal 19' at the bottom of the contact plug as illustrated in FIG. 1. While the barrier metal 19 is formed, the undercut 25 may become a void. The barrier metal 19' at the bottom of the contact plug is electrically connected in series with the contact plug and the lower interconnection 13 between the copper layers. The barrier metal 19 is typically composed of tantalum (Ta) or tantalum nitride (TaN) of which conductivity is lower than that of copper, thereby causing the resistance to be increased at an interface of the via contact. As the size of the contact is reduced as device integration increases, the density of current passing through the via or contact hole becomes higher than that at each interconnection. Therefore, a probability of cutting caused by electro-migration becomes higher at the via or contact. In particular, the electro-migration becomes an especially serious issue at the portion where contact plugs for connecting interconnections of each layer are vertically connected, because current crowding arises at these locations. At this portion, the barrier metal prevents connection between the copper layers of the contact plug and the lower interconnection. Therefore, a void is generated so as to elevate the probability of cutting.

SUMMARY OF THE INVENTION

The present invention addresses the limitations of the aforementioned approaches that are caused by the barrier metal that is used to form a contact plug for metal multi-level interconnections. It is therefore a feature of the present invention to provide a semiconductor device, where the metal of a lower interconnection and that of a via contact plug are in direct contact with each other, without a barrier layer therebetween, in at least a portion of the interface.

It is another feature of the present invention to provide a semiconductor device that is structured to decrease contact resistance and to prevent shortening of product life due to electro- and stress-migration in the vicinity of a contact interface, and a method for fabricating the same.

It is still another feature of the present invention to provide a semiconductor device that may extend the term of guarantee of products and improve product characteristics with a reduction in circuit resistance, and a method for fabricating the same.

In accordance with an aspect of the present invention, there is provided a semiconductor device comprising a lower metal interconnection having a copper layer, an interlayer dielectric (ILD) formed on the copper layer of the lower metal interconnection, and an upper metal interconnection formed on the ILD. The ILD includes lower and upper barrier layers that have an etch selectivity with respect to each other. The lower and upper metal interconnections are connected by a via contact plug that penetrates the ILD. The via contact plug comprises an inner copper layer. A portion of the via contact plug crossing the lower barrier layer is formed to have a greater width as compared to a portion crossing the upper barrier layer. A barrier metal layer is disposed on a sidewall of the via contact plug and on a portion of the bottom of the via contact plug. Namely, the barrier metal layer is composed of a first portion on the sidewall of the via contact plug and a second portion on a portion of the bottom of the via contact plug, the first portion and the second portion of the barrier metal layer being discontinuous. Accordingly, the lower metal interconnection is in direct contact with the bottom of the via contact plug, where the second portion of the barrier metal layer is not formed.

In the present invention, the lower and upper metal interconnections comprise a copper layer and the barrier metal layer covering the bottom and the sidewalls of the copper layer.

The upper and lower barrier layers may be layers that serve as a barrier to copper, such as a silicon nitride layer or silicon carbide layer. But, the upper and lower barrier layers are composed of different layers so as to have different etch rates with respect to a certain etchant.

The via contact plug and the upper metal interconnection may be simultaneously composed of an identical material by a dual damascene process.

The barrier metal may be composed of one selected from the group consisting of refractory materials such as tungsten, tungsten nitride, and niobium (Nb), tantalum, tantalum nitride, titanium, titanium nitride, and three-atom materials such as tantalum silicide nitride, titanium silicide nitride, and tungsten silicide nitride.

The ILD is typically formed to a greater thickness than the upper and lower barrier layers. The ILD is preferably composed of one of low k-dielectric insulating materials like FSG (fluoro silicate glass), black diamond, and SiLK.

In accordance with another aspect of the present invention, there is provided a method for fabricating a semiconductor device comprising forming a lower metal interconnection on a substrate covered with an insulation layer. A lower barrier layer and an upper barrier layer are formed on the lower metal interconnection. The lower and upper barrier layers have different etch rates with respect to each other. An etch mask for a via contact is formed. The ILD with the upper barrier layer is anisotropically patterned to expose the lower barrier layer. The exposed lower barrier layer is etched using an isotropic etch process to form a via contact hole. The via contact hole has an undercut portion at the lower barrier layer with respect to the upper barrier layer and exposes a portion of the lower metal interconnection. A barrier metal layer is formed on an entire surface of the substrate where the via contact hole is formed. The barrier metal layer has a discontinuous part at the lower barrier layer. A copper layer is stacked on the substrate where the barrier metal layer is formed to form the via contact hole.

The lower metal interconnection is generally composed of copper using a damascene process, like the via contact hole. When a groove formed over the substrate by the damascene process is filled with a copper layer, a barrier metal layer is first formed to a thin thickness and the copper layer is then stacked on the resultant structure where the barrier metal layer is formed. The barrier metal layer may be formed by sputtering or chemical vapor deposition (CVD). A method of stacking the copper layer after forming the barrier metal layer typically comprises forming a copper seed layer on the barrier layer. The seed layer is preferably formed by CVD because the copper layer should be conformally stacked on the entire surface of the barrier layer. In addition to the seed layer, a thick copper bulk layer may be stacked using an electroplating technique to fill the via contact hole. When a width of the via contact hole is narrow, the copper layer may be stacked still using CVD to fill the via contact hole.

An insulation layer, which is typically thicker than the barrier layer, is further formed on the lower and upper barrier layers, thereby constituting the ILD. When the ILD is patterned to form the via contact hole, the ILD and the upper barrier layer may be successively etched simultaneously using an anisotropic etch process. The lower barrier layer is isotropically etched by an etchant having a higher etch rate with respect to the ILD and the upper barrier layer. Preferably, a width of the via contact hole is discontinuously widened at a portion of the lower barrier layer to form an undercut under the upper barrier layer. At this time, the lower barrier layer is composed of a nitride layer and the upper barrier layer is composed of a silicon carbide layer. The lower barrier layer is etched during a wet etch process using a phosphoric acid.

BRIEF DESCRIPTION OF THE DRAWINGS

The above and other features and advantages of the present invention will become readily apparent from the description that follows, with reference to the accompanying drawings, in which.

DETAILED DESCRIPTION OF PREFERRED EMBODIMENTS

Figure 1:
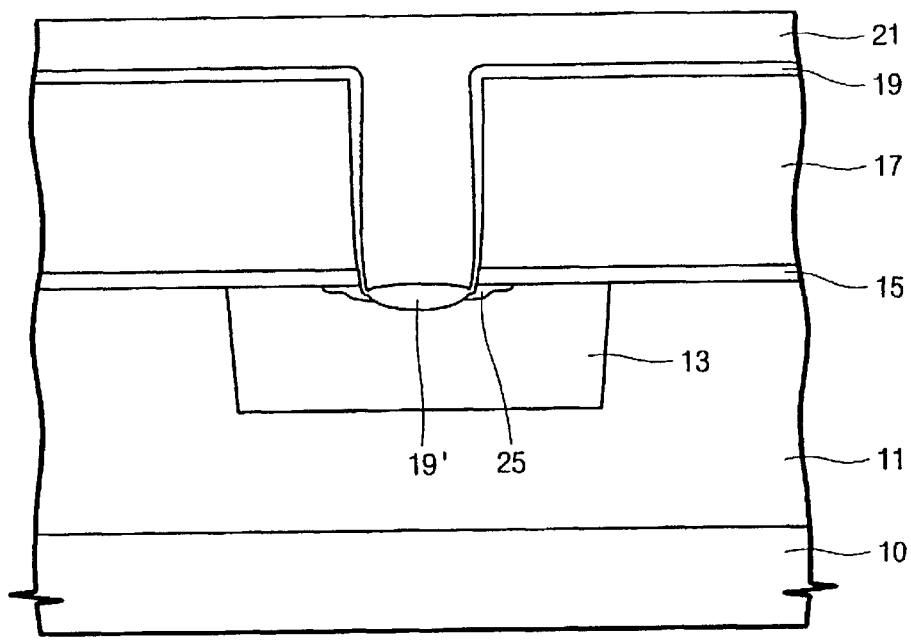
FIG. 1 is a cross-sectional view illustrating a step of forming a via contact in a semiconductor device with conventional multi-level interconnections.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

(Embodiment 1)

FIGS. 2 through 6 are cross-sectional views illustrating steps of forming a via contact plug in a semiconductor device with multi-interconnections according to an embodiment of the present invention.

Figure 2:
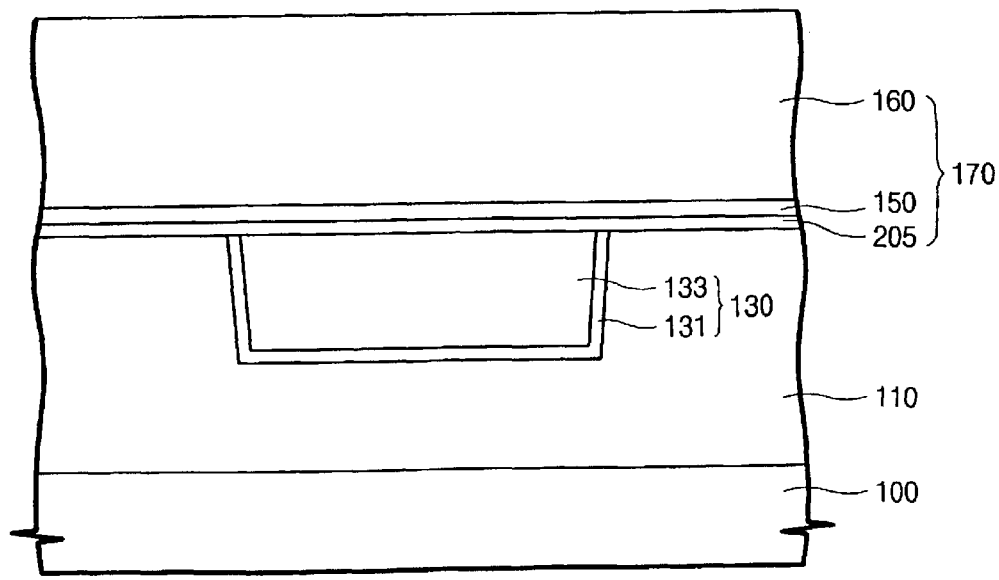
FIGS. 2 through 6 are cross-sectional views illustrating steps of forming a via contact in a semiconductor device with multi-interconnections according to an embodiment of the present invention.
Figure 5:
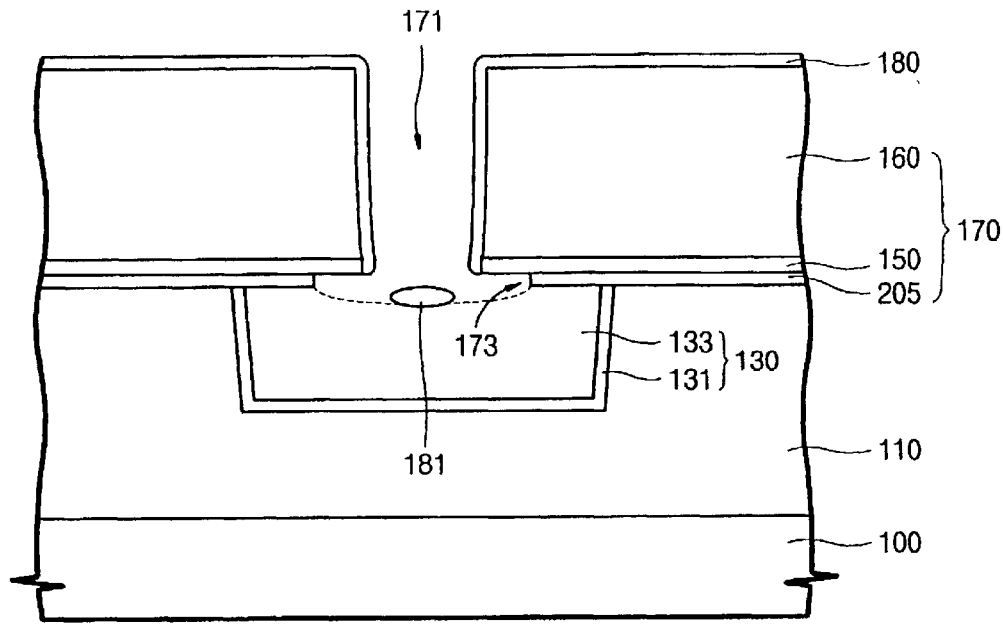

Referring to FIG. 2, a first ILD 110 is formed to cover a device formed at a substrate 100. A groove for a lower interconnection 130 is formed in the first ILD 110 and is then sequentially filled with a first barrier metal layer and a first copper layer. The first barrier metal layer and the first copper layer, which cover a top surface of the first ILD 110, are etched by CMP. As a result, a first barrier metal pattern 131 and a first copper pattern 133 remain in the groove to form a lower interconnection 130. A second ILD 170 is formed on the substrate where the lower interconnection 130 is formed. The second ILD 170 includes a lower barrier layer 205, an upper barrier layer 150, and a first insulation layer 160, which are sequentially stacked. The lower barrier layer 205 may, for example, comprise a silicon nitride layer, and the upper barrier layer 150 may, for example, comprise a silicon carbide layer having an etch selectivity with respect to the silicon nitride layer. The lower and upper barrier layers 205 and 150 may, for example, be formed to a thickness of approximately 10 to 1000 angstroms. The lower barrier layer 205 is preferably formed to a greater thickness than a barrier metal 180 as illustrated in FIG. 5 below, to be used for the via contact. The first insulation layer 160 formed on the upper barrier layer 150 may be composed of FSG (fluoro silicate glass), black diamond, and a material named SiIK, which are low k-dielectrics, and may be formed to a thickness of 2000 to 10000 angstroms.

Figure 3:
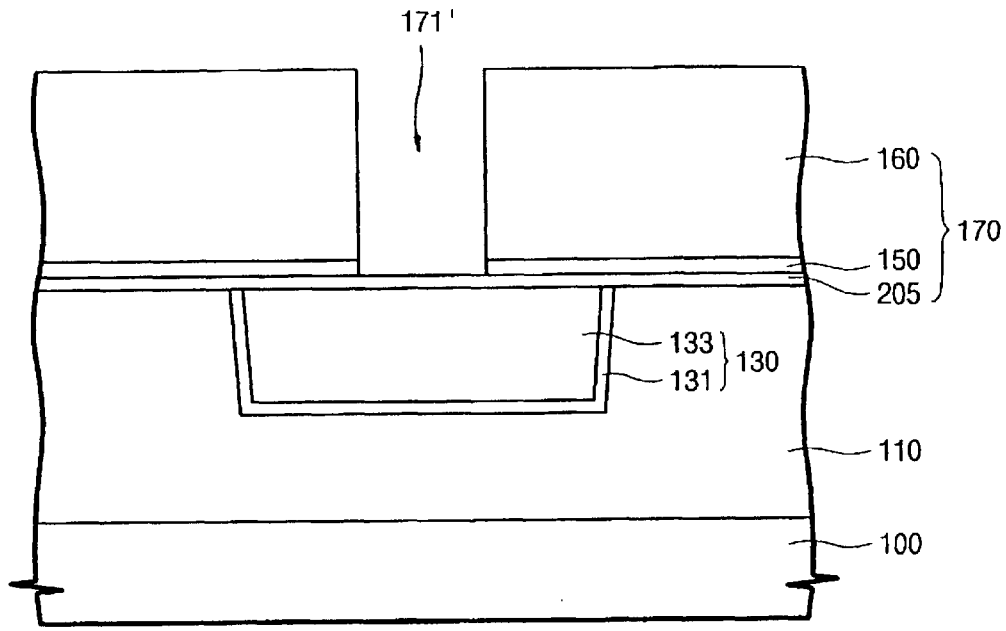

Referring to FIG. 3, the first insulation layer 160 and the upper barrier layer 150 are patterned to form a contact hole 171'. In more detail, forming the contact hole 171' includes forming a photoresist pattern on the second ILD 170 using a photolithographic process, and then anisotropically etching the first insulation layer 160 and the upper insulation layer 150 by using the photoresist pattern as an etch mask.

Figure 4:
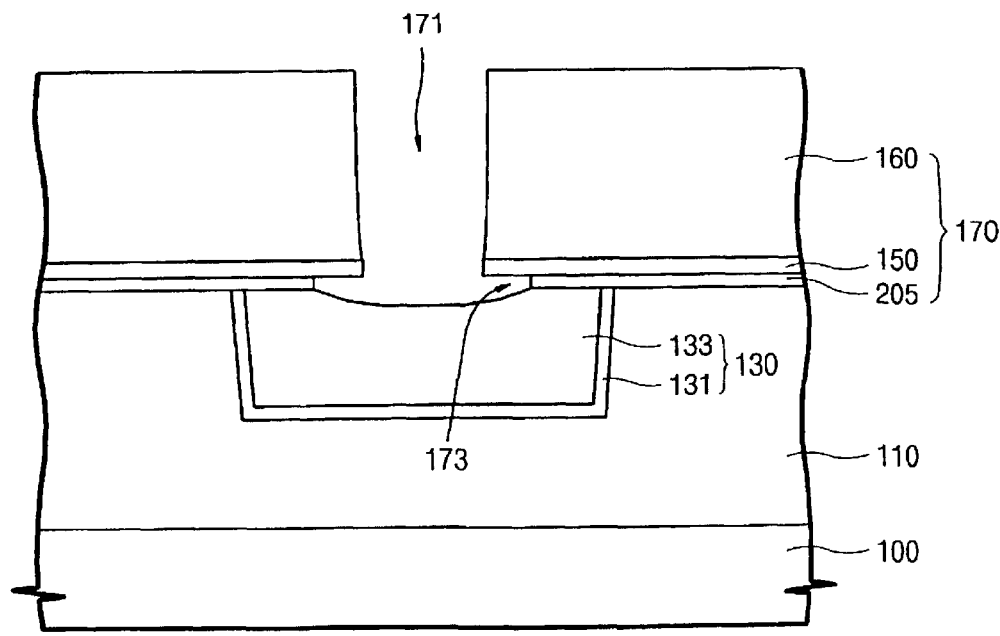

Referring to FIG. 4, the lower barrier layer 205 composed of a silicon nitride layer is etched during a wet etch process using a phosphoric acid. As a result, a contact hole exposes the lower interconnection 130. The contact hole 171 is discontinuously widened at the lower barrier layer 205, thereby forming an undercut 173 under the upper barrier layer 150. At this time, the first copper pattern 133 at the lower interconnection 130 is partially recessed. Thus, the exposed upper portion of the lower interconnection 130 becomes concave. Next, a wet cleaning process is conducted to remove residue from the exposed lower interconnection 130. A portion of the first copper pattern 133 of the lower interconnection 130 may be additionally recessed during the wet cleaning process. The undercut 173 and the recessed portion of the lower interconnection 130 are connected to form a considerably wide space.

Referring to FIG. 5, a relatively thin second barrier metal layer 180 is formed on the substrate. The second barrier metal layer 180 is preferably formed to a smaller thickness than the lower barrier layer 205. The second barrier metal 180 may be formed at a high deposition rate using sputtering or CVD. Thus, the second barrier metal 180 is not formed at the lower barrier layer 205 where the undercut 173 is formed, and is formed to cover a portion of the bottom (i.e., central part) and sidewalls of the contact hole 171. That is, the second barrier metal is discontinuously formed. The second barrier metal layer 180 covering the sidewalls of the contact hole 171 is therefore separated from a portion of the second barrier metal pattern 181 that forms at the bottom of the contact hole 171.

Figure 6:
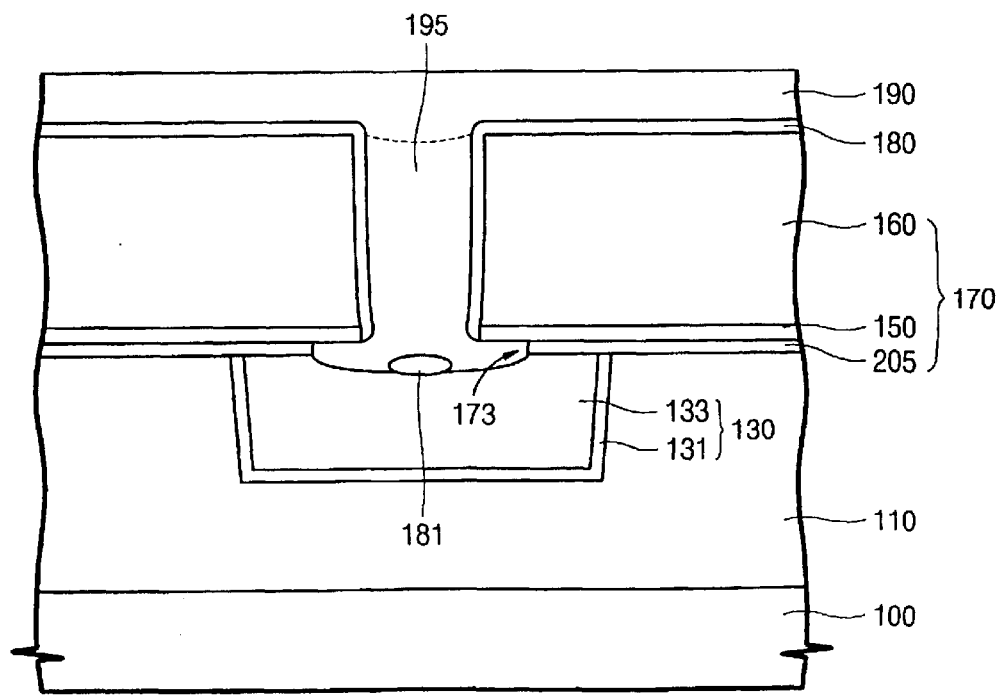

Referring to FIG. 6, a second copper layer 190 is stacked on an entire surface of the substrate where the second barrier metal layer 180 is formed. When the second copper layer 190 is initially stacked, a copper seed layer is formed to a thin thickness at a low deposition rate using CVD so as to fill every remaining spaces. After forming the seed layer, the remaining space of the contact hole is filled using an electroplating technique. The second barrier metal layer 180 and the second copper layer 190 are stacked also on the second ILD 170. Accordingly, the undercut 173 where the lower barrier layer 205 is etched is completely filled with the second copper layer 190, i.e., a contact plug 195. Also, the first copper pattern 133 and the second copper layer 190 are in direct contact with each other without an intervening second barrier metal layer 180 or second barrier metal pattern 181.

(Embodiment 2)

Figure 7:
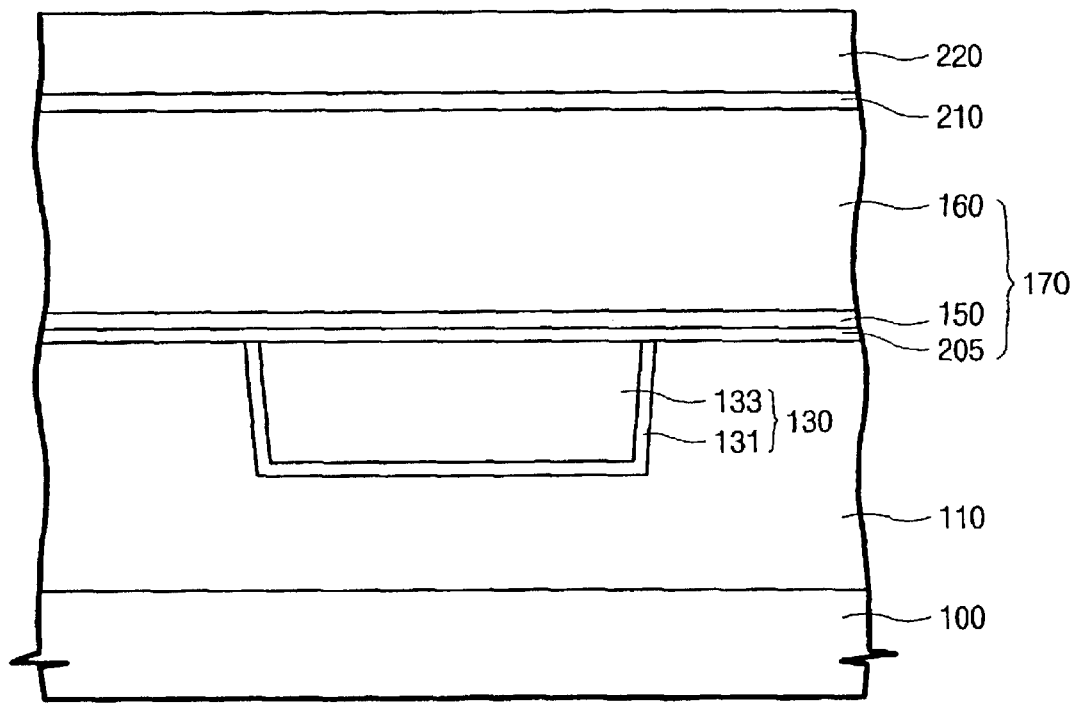
FIGS. 7 through 11 are cross-sectional views illustrating steps of forming a via contact according to another embodiment of the present invention.

In a second embodiment, referring to FIG. 7, after forming the first insulation layer 160 on the upper barrier layer 150, an etch stop layer 210 and a second insulation layer 220 are sequentially formed thereon. The etch stop layer 210 is composed of a material that has an etch selectivity with respect to the second insulation layer 220, and the second insulation layer 220 may be composed of a material similar to the first insulation layer 160.

Figure 8:
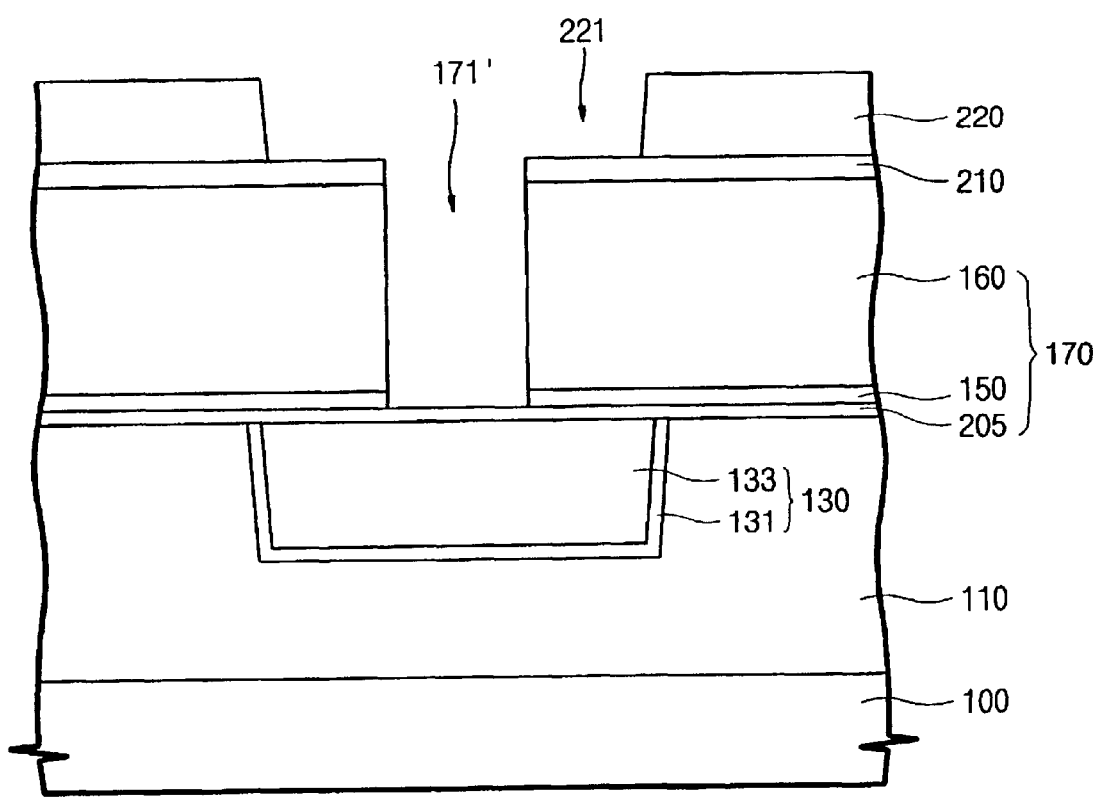

Referring to FIG. 8, a patterning process is carried out twice to form a groove 221 and a via contact hole 171' where an upper interconnection will be formed. The process of forming the groove 221 and the process of forming the via contact hole 171' may optionally be conducted in an reverse order. In the example where the groove 221 is formed first, the second insulation layer 220 is patterned to form a groove 221 which will be filled with the upper interconnection. While an etch process is performed to form the groove 221, the etch stop layer 210 defines a resultant etching depth. The etch stop layer 210 exposed by the groove 221 is etched. The via contact hole 171' exposing the lower barrier layer 205 is formed at a portion of the groove 221 by performing the second patterning process. At this time, the first insulation layer 160 and the upper barrier layer 150 may be successively etched.

Figure 9:
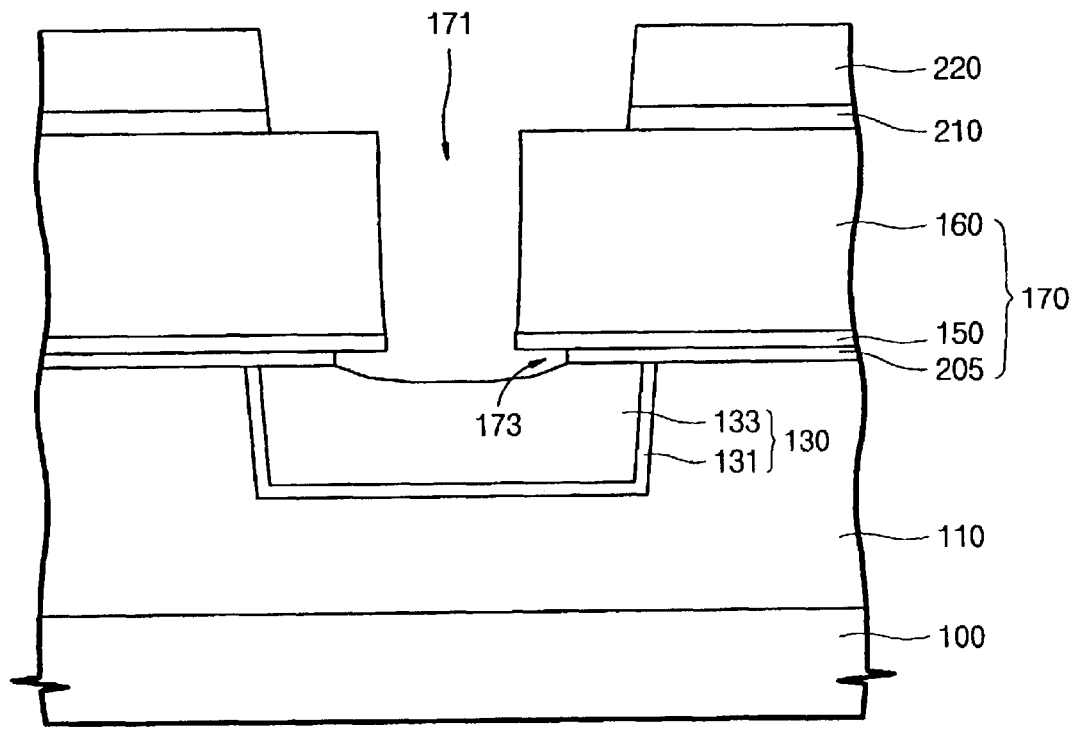

Referring to FIG. 9, a wet etch process using phosphoric acid is applied to the resultant structure exposing the lower barrier layer 205 so as to complete the via contact hole 171. At this time, while the lower barrier layer 205 is etched at the via contact hole 171, so that the etched width of the lower barrier layer 205 is wider than that of the upper barrier layer 150. As a result, an undercut 173 is formed under the upper barrier layer 150. A cleaning process is then carried out. When the lower barrier layer 205 is etched and cleaned, a portion of the first copper pattern 133 of the lower interconnection 130 may be also etched. As a result, a downwardly concave space connected to the undercut 173 which is formed at the lower barrier layer 205 is formed on the lower interconnection 130.

Figure 10:
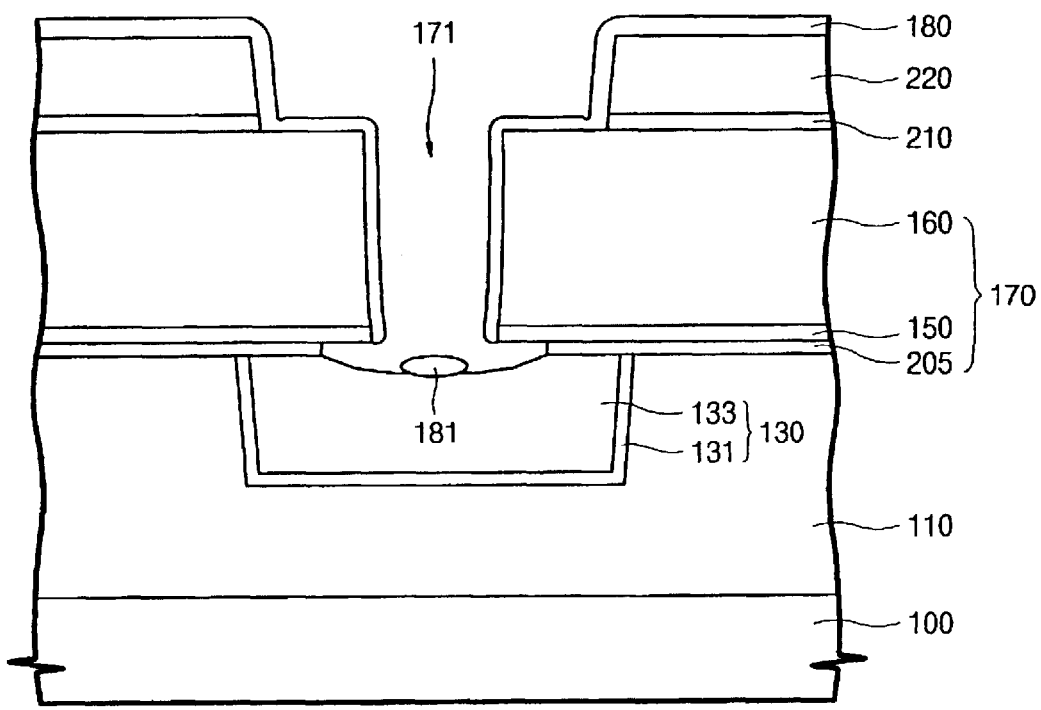

Referring to FIG. 10, the second barrier metal layer 180 is conformally stacked using sputtering or a CVD method on the substrate where the groove 221 and the via contact hole 171 are formed. However, the second barrier metal layer is not stacked at the undercut 173 where the lower barrier layer 205 is etched such that the via contact hole 171 is discontinuously widened. Also, a second barrier metal pattern 181, which is isolated from the second barrier metal layer 180 covering the sidewalls of the via contact hole, is formed on the bottom of the via contact hole 171.

Figure 11:
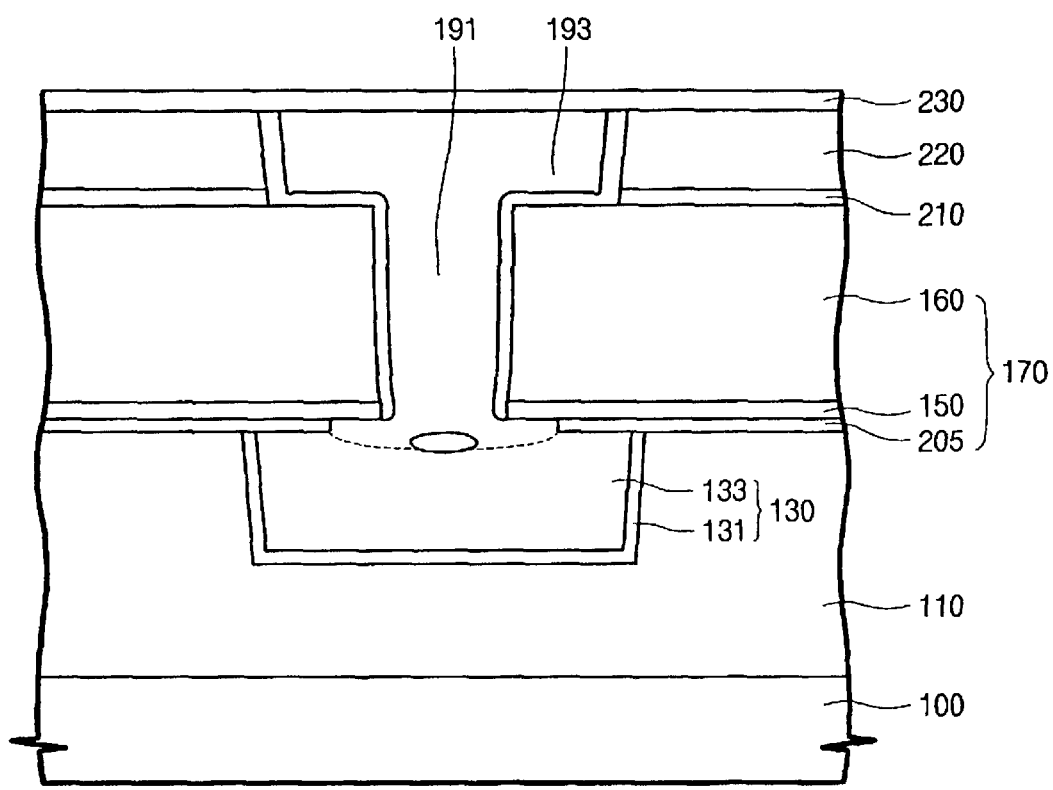

Referring to FIG. 11, the second copper layer is stacked on the substrate where the second barrier metal layer 180 is formed, thereby filling the already formed groove 221 and via contact hole 171. Next, the second barrier metal layer 180 and the second copper layer, which are stacked over the second insulation layer 220, are etched using a CMP method. As a result, a via contact plug 191 and an upper interconnection 193 are formed. A silicon nitride layer is formed as a capping layer 230 on the substrate where the upper interconnection 193 is formed, in order to prevent diffusion of copper atoms of the upper interconnection 193 during a subsequent process. The upper and lower metal interconnections are connected through the via contact including the barrier metal layer with a discontinuous portion.

In view of the resultant semiconductor device, the lower copper interconnection is formed on the insulation layer of the substrate, and the ILD including the lower and upper barrier layers are formed on the lower metal interconnection. Also, the upper metal interconnection, which is connected to the lower copper interconnection by the via contact plug, is formed on the ILD. The via contact plug, which penetrates the ILD to connect the lower and upper metal interconnections, is formed such that a portion crossing the lower barrier layer is discontinuously wider than that crossing the upper barrier layer. The barrier metal does not exist at the portion crossing the lower barrier layer, and thus the contact plug is in direct contact with the lower interconnection. Therefore, interface resistance is very low between the contact plug and the lower interconnection. As a result, heat generation is reduced, and electro- and stress-migration may be decreased. In addition, even if there is electro-migration, the copper layers are connected between the lower and upper interconnections 130 and 190, resulting in a lower probability of the generation of the void or cutting phenomena.

According to the present invention, the barrier metal layer of a portion where an electric field is concentrated is removed from the via contact interface. Thus, a contact resistance may be reduced, and electro- and stress-migration may be minimized. As a result, generation of a void or cutting may be prevented at the connection so as to improve reliability of the semiconductor devices.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor device comprising:
   a lower metal interconnection having a copper layer;
   an interlayer dielectric (ILD) formed on the copper layer of the lower metal interconnection, the ILD having a lower barrier layer and an upper barrier layer that have an etch selectivity with respect to each other;
   an upper metal interconnection formed on the ILD;
   a via contact plug formed of copper penetrating the ILD to connect the lower and upper metal interconnections; and
   a barrier metal layer having a first portion on side walls of the via contact plug and a second portion at the bottom of the via contact plug, the first and second portions of the barrier metal layer being discontinuous;
   wherein a portion of the via contact plug crossing the lower barrier layer has a greater width as compared to a portion crossing the upper barrier layer,
   and wherein the second portion of the barrier metal layer is spaced apart from the first portion of the barrier metal layer such that the lower metal interconnection is in direct contact with the via contact plug at the spaced apart region.

2. The device as claimed in claim 1, wherein the upper metal interconnection and the via contact plug are directly connected as one body.

3. The device as claimed in claim 1, wherein the ILD further comprises a layer composed of one of FSG (fluoro silicate glass), black diamond, and SilK on the upper barrier layer.

4. The device as claimed in claim 1, wherein the upper barrier layer is one of a silicon nitride layer and a silicon carbide layer.

5. The device as claimed in claim 1, wherein the lower barrier layer is one of a silicon nitride layer and a silicon carbide layer.

6. The device as claimed in claim 1, wherein the barrier metal layer is composed of one selected from the group consisting of tungsten, tungsten nitride, niobium (Nb), tantalum, tantalum nitride, titanium, titanium nitride, tantalum silicide nitride, titanium silicide nitride, and tungsten silicide nitride.

7. The device as claimed in claim 1, wherein the via contact plug includes an outer CVD seed layer contacting the barrier metal layer and an inner electroplating layer.

8. The device as claimed in claim 1, wherein sidewalls and a bottom of the copper layers of the lower and upper metal interconnections are encompassed with a barrier metal.

9. The device as claimed in claim 1, wherein the via contact plug is formed to have a greater width at an interface between the lower and upper barrier layers.

10. A semiconductor device comprising:
    a lower metal interconnection formed on a substrate;
    an ILD formed on the lower metal interconnection, the ILD having a lower barrier insulation layer and an upper barrier insulation layer that have an etch selectivity with respect to each other;
    an upper metal interconnection formed on the ILD, the upper metal interconnection separated from the lower metal interconnection by the ILD;
    a via contact plug penetrating the ILD to connect the lower and upper metal interconnections, wherein the via contact plug has an inner metal layer; and
    a barrier metal layer having a first portion on side walls of the inner metal layer of the via contact plug and a second portion at a bottom of the inner metal layer of the via contact plug,
    wherein the via contact plug is formed such that a portion crossing the lower barrier layer has a greater width than that of a portion crossing the upper barrier layer,
    and wherein the second portion of the barrier metal layer is spaced apart from the first portion of the barrier metal layer such that the lower metal interconnection is in direct contact with the via contact plug at the spaced apart region.

11. The device as claimed in claim 10, wherein the lower and upper metal interconnections are composed of one selected from the group consisting of copper, aluminum, tungsten, gold, and silver.

\* \* \* \* \*